United States Patent [19]

Hubbard et al.

[11] Patent Number: 5,016,085
[45] Date of Patent: May 14, 1991

[54] HERMETIC PACKAGE FOR INTEGRATED CIRCUIT CHIPS

[75] Inventors: Douglas A. Hubbard, Canoga Park; Louis E. Gates, Jr., Westlake Village, both of Calif.

[73] Assignee: Hughes Aircraft Company, Los Angeles, Calif.

[21] Appl. No.: 164,282

[22] Filed: Mar. 4, 1988

[51] Int. Cl.5 .................... H01L 23/02; H01L 23/16
[52] U.S. Cl. ........................ 357/74; 357/80; 361/401; 361/414
[58] Field of Search .................. 361/401; 357/74, 80

[56] References Cited

U.S. PATENT DOCUMENTS

| | | | |
|---|---|---|---|
| 4,288,841 | 9/1981 | Gogal | 357/74 |
| 4,320,438 | 3/1982 | Ibrahim et al. | 361/401 |
| 4,322,778 | 3/1982 | Barbour et al. | 361/348 |
| 4,328,531 | 5/1982 | Nagashima et al. | 361/401 |
| 4,336,088 | 6/1982 | Hetherington et al. | 361/406 |
| 4,630,172 | 12/1986 | Stenerson et al. | 357/74 |
| 4,705,917 | 11/1987 | Gates, Jr. et al. | 361/401 |
| 4,839,717 | 6/1989 | Phy et al. | 357/80 |
| 4,860,165 | 8/1989 | Cassinelli | 361/414 |
| 4,922,325 | 5/1990 | Smeltz, Jr. | 357/80 |

FOREIGN PATENT DOCUMENTS 0042247 3/1983 Japan .
0279160 12/1986 Japan ..................... 357/70

Primary Examiner—Andrew J. James
Assistant Examiner—Viet Q. Nguyen
Attorney, Agent, or Firm—Leonard A. Alkov; Wanda K. Denson-Low

[57] ABSTRACT

The hermetic package (10) has an interior recess (46) for receipt of a semiconductor chip. The recess is square and set at 45° with respect to the rectangular exterior of the package. The ceramic layers which make up the package carry conductive planes thereof with the interior opening stepped to provide connection points. The lowest layer having a chip opening therein may be left out of the assembly to provide a shallower chip opening recess.

12 Claims, 2 Drawing Sheets

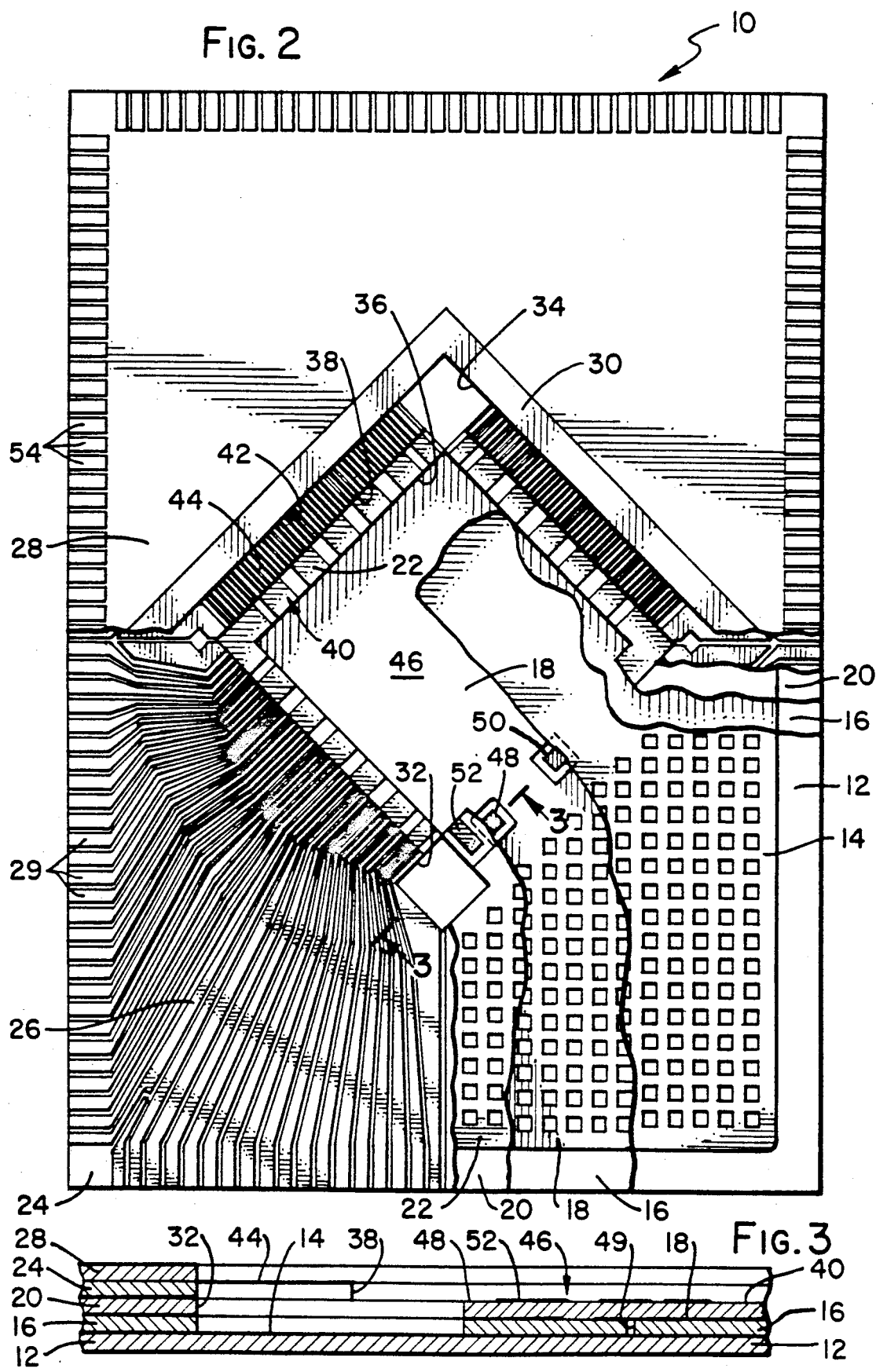

HERMETIC PACKAGE FOR INTEGRATED CIRCUIT CHIPS

The government has rights in this invention pursuant to Contract No. F 33615-83-C-0043 under McDonald Douglas Purchase Order No. E 31011L awarded by the Department of the Air Force.

BACKGROUND

This invention is directed to a hermetic package for the protecting, housing, cooling and interconnecting of an integrated circuit chip. The package is made of a plurality of ceramic layers each of which carries a particular electrically conductive pattern and which has interior openings therein so as to provide recesses in which the chip and discrete components can be located and connected. The package may include locations for discrete components such as resistors and capacitors. In computer and in similar circuits, the actual processing of information is done entirely by the circuitry on the microelectronic chips, and this suggests that the functions of packaging are simply to protect the chips, interconnect them with other devices, and to distribute electric power. However, in many high-speed data processing units, packaging configuration is an important factor which determines or limits performance, cost and reliability. One reason packaging has become so important is the imperative to make the central elementary computing system exceedingly compact. Improvements in the design and fabrication of microelectronic devices have greatly increased the number of logic functions that can be placed on a single chip as well as the speed at which logic functions are performed. As a result, a major source of delay in the central processing unit of many computers is the time required for a signal to pass between chips. In order to reduce this delay, the chips must be placed close together. Putting many chips into a small volume challenges packaging technology in several ways. There is little space available for the many conductors required to distribute power and information bearing signals on the chips. In addition, the properties of this network of conductors must be such as to minimize the distortion of signals.

An integrated circuit chip with many functions leads to a chip of large size an with many connections. Such normally requires a larger chip package, both to physically accommodate the chip and to provide the necessary external connection pads. However, in a complicated circuit, there are many such chips mounted on and connected to a printed wiring board. Utilization of a minimum amount of board space becomes important both to maximize the number of chips and thus the number of functions mountable on the board and also to minimize the connection lengths. Packages must be provided to fit a minimum space and to maximize internal chip size capacity.

Furthermore, such a dense array of chips gives off sufficient heat that cooling is an important consideration. Signal delays occur because of finite length of lines interconnecting chips as well as lines interconnecting capacitive, resistive or inductive circuit discrete devices with a portion of the circuit. Signal delays are increased when such interconnecting lines are made outside of the package. Extended leads of this nature reduce circuit response time. Another important feature of a package into which a circuit chip is to be inserted is the interconnection between the chip and the package. It must be convenient within the package so that accurate interconnection can be made. Furthermore, the connections on the exterior of the package must also be located in such a manner that the package can be appropriately interconnected into the remainder of the circuit. Accordingly, there is need for a microelectronic package which satisfies the diverse requirements of the electronic system in which its contained chip will be employed.

SUMMARY

In order to aid in the understanding of this invention, it can be stated in essentially summary form that it is directed to a circuit chip package formed of a plurality of layers of ceramic, with some of the layers having openings in the interior thereof to form recesses within the package. Some of the layers carry circuitry thereon in such a manner as to form a shelf along one or more edges of the recess, for ease of interconnection. The recesses incorporate positions in which discrete components can be located and connected into the circuitry.

Package layers may be added or left out to add or subtract interior redundant connection shelves and concomitantly subtract or add package interior chip space. As required, via extend through ceramic layers to interconnect circuitry on different ceramic layers.

It is, thus, a purpose and advantage of this invention to provide an integrated circuit chip package into which a semiconductor chip can be secured for thermal control and physical protection, and connected to conductors in the package which may externally connect or connect through via to other circuitry in the package so that a microelectronic circuit chip can be connected and protected.

It is another purpose and advantage of this invention to provide a microelectronic package which is made of a plurality of layers of ceramic with at least some of the layers carrying conductors thereon, and having and opening therein to define one or more recesses in which a microelectronic chip and discrete devices such as decoupling capacitors can be located.

It is a further purpose and advantage of this invention to provide a microelectronic package which provides the necessary connectors for distribution of signals and power to and from a microelectronic chip, with the properties of the network being such as to minimize distortion of the signals and wherein the package permits removal of heat from the chip and package so that the package is suitable for high reliability and high performance circuitry.

It is a further purpose and advantage of this invention to provide a microelectronic circuit chip package in which layers can be added to provide redundant connection shelves and layers can be removed to provide a larger interior space for the receipt of a larger semiconductor chip.

It is another purpose and advantage of this invention to provide a rectangular hermetic package having connecting pads along all four edges thereof, and having a chip receiving recess therein which may be oriented at substantially a 45° angle with respect to the exterior outline of the package to maximize spacing between conductive signal traces in the package.

Other purposes and advantages of this invention will become apparent from a study of the following portion of this specification, the claims and the attached drawings.

BRIEF DESCRIPTION OF THE DRAWINGS

FIG. 2 is a plan view thereof, with portions of the various layers broken away to show portions of the several layers.

FIG. 3 is an enlarged section taken generally along line 3—3 of FIG. 2.

DESCRIPTION OF THE PREFERRED EMBODIMENT

Figure 1:
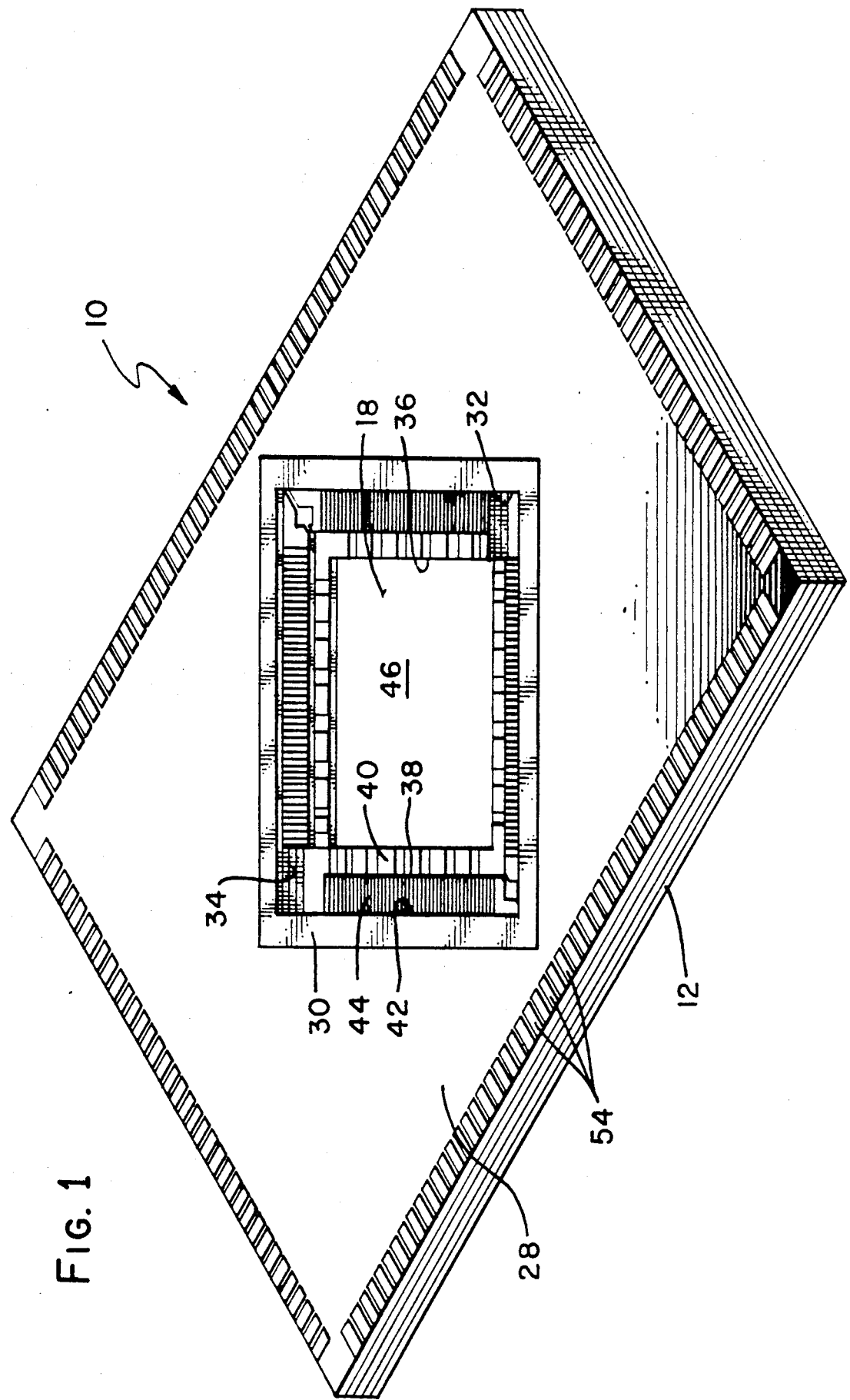
FIG. 1 is an isometric view of the hermetic package for integrated circuit chips in accordance with this invention.

The package 10 is made up of a plurality of alumina ceramic layers which are individually produced, stacked, and then fused together to complete the package. Since the package is manufactured in such a manner, it is appropriate to describe the various layers so that their structure and function in the completed package can be understood. The bottommost structural layer is base 12. Base 12 is preferably square or rectangular, with a rectangular base being shown. Printed onto the top of base 12, shown in FIG. 2, is ground plane 14. Ground plane 14 is an electrically conductive plane screen-printed onto the base in a generally all-over pattern. The printed material is a metal paste which fuses to the surface when properly sintered with overlying layers of ceramic and metal to become a metal film which is integrally bonded to the ceramic. The pattern of nonmetalized squares saves metal and promotes knitting and good adhesion between layers. The purpose of base 12 with its ground plane 14 is to provide a structural base for mounting the package, to conduct heat out of the package into the structure upon which it is mounted, provide an overall ground plane for EMI protection, and to provide a mounting base and electrical connection for discrete capacitors.

Voltage layer 16 with its voltage plane 18 is positioned next in the stack. Above the voltage layer is ground layer 20 with its ground plane 22. Next is signal layer 24 with its plurality of circuit traces which form the signal plane 26. Top layer 28 overlies the signal plane and carries catch pads 29 and metallized seal ring 30 thereon. Each of the layers 16, 20, 24 and 28 is a ceramic layer having appropriate tungsten printed paste metallization for its purpose, and each layer 12 will be described in more detail hereafter. Layers 12, 16, 20, 24 and 28 are made of alumina. After each layer has its metallization plane appropriately printed thereon and the layer is cut and punched as required, the layers are stacked and fused. After fusing, the metallization is nickel-plated and then gold-plated. These steps and the details of the layers will be described in more detail below, but it is important at this stage to note that each of the layers 16, 20, 24 and 28 has a pair of openings therein with the openings aligned to provide two capacitor cavities 32 and 34. Capacitor cavity 32 is shown in enlarged detail in FIG. 3, and it is seen that it extends all the way down to ground plane 14 on base layer 12.

Layer 20 has an opening 36 therein which exposes voltage plane 18 over the general area. Signal layer 24 has an opening 38 therein which exposes the inner edge of ground layer 20 to form a shelf 40 which is available for connection. Top layer 28 has an opening 42 therein which is larger than the opening 38 to expose a shelf 44 which carries the interior ends and pads of the signal layer circuit traces. The openings 36, 38 and 42 are progressively stepped larger, but their axes are in alignment to define the central opening 46 which is for receipt of the integrated circuit chip. Shelves of uniform width are defined by the progressively larger openings. However, the capacitor cavities 32 and 34 are rectangular cavities without shelves extending down to ground plane 14, while the central opening 46 is open down to voltage plane 18.

Reviewing the layers in more detail from bottom to top, base layer 12 carries thereon ground plane 14 which has a hatched surface away from the portion of the layer below central opening 46 However, below the central opening 46, the ground plane 14 is continuous, as is seen in the broken-away portion to the right center of FIG. 2. Similarly, voltage plane 18 on voltage layer 16 is hatched away from the area at the bottom of the central opening 46, but all across the bottom opening (that is, the area visible within opening 36), the layer is a continuous conductive voltage plane In that area of voltage plane 18 which is covered by shelf 40, there is a plurality of pads, two of which are seen at 48 and 50, which are electrically isolated from the voltage plane. These pads are connected down through via such as via 49 to the ground plane 14 therebelow. There are ground pads, such as ground pads 48 and 50, all around the central opening 46 beneath shelf 40. Ground plane 22 on ground layer 20 is hatched over the general area, as is seen in FIG. 2, but on the exposed shelf 40 it has voltage pads thereon which are isolated from the ground plane and are connected by via to the voltage plane 18 therebelow. Voltage pad 52 is shown in FIG. 2 and is completely exposed, rather than only partly exposed on shelf 40, by the breaking away of the portion of the signal layer shelf which normally covers the outer edge thereof. Around the shelf 40, the pads which are connected by via to appropriate planes therebelow are alternately ground pads and voltage pads.

The circuit traces on signal plane 26 are traces which interconnect the exterior catch pads 29 on the exterior edge of signal plane 26 with the interior pads on the interior shelf 44. The central opening 46 is turned at 45° with respect to the exterior rectangular dimensions to increase the available space inbetween the circuit traces connecting between the interior and exterior pads. Top layer 28 exposes the shelf 44. Top layer 28 carries external connection pads 54 around the edges. These external connection pads are connected downward through via to the respective catch pads 29 on the signal plane below. After a chip is placed in the central opening and connected, a cover, not shown, is placed over and is hermetically sealed on seal ring 30. Printed tungsten is a suitable material for the metallic seal ring 30.

The individual ceramic layers on the layered structure are made by mixing the selected ceramic materials (aluminum oxide and minor oxide additives known in the art) with a binder and solvent. The mixture is milled and cast to uniform thickness and dried, driving out the solvent. The result is a sheet of material that is sufficiently structurally sound for handling. The individual layer elements are stamped out, including punching of the via and other lateral features such as cavities or openings. On each layer a conductive metal paste is placed thereon in the desired pattern, such as by screening, and the paste is forced through the via. The stack is assembled and laminated under moderate pressure and is carefully heated to sintering temperature by techniques well known in the art. The binder is driven off, while the alumina and metal are fused into a monolithic ceramic and metal structure. The structure is now unitary and the circuitry therein can be tested for continuity and short circuits before further work.

In use, the semiconductor chip is placed in central opening 46, within opening 36. The semiconductor chip is connected by gold wire ball bonding to the pads on the signal layer and to the voltage and ground pads on shelf 40. When the chip is very large, it may not fit within the opening 36. In that case, the layer 20 is left out of the stack during assembly and prior to sintering. This provides a larger central opening out to the opening 38. At the same time, the ground pads 48 and 50 and their companion ground pads around the opening 38 are exposed. Thus, the larger chip can be inserted and connected to the signal layer and can get its voltage and ground connections on the voltage plane 18 and at the ground pads 48 and 50, et seq., located around opening 38. In this case, when the ground layer 20 and its ground plane 22 are left out of the assembly, signal layer 24 may be made of more thick material to increase the depth of the central opening which was partially lost by the absence of layer 20. In this way, the package 10 can be assembled to provide a laterally larger central opening.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A package for integrated circuit chips, comprising:
   a dielectric base layer serving as the bottom of said package, a metallic film conductive ground plane secured to the top of said dielectric base layer for connection to ground potential;
   a dielectric voltage layer directly on the top of said ground plane, walls defining at least one component opening through said dielectric voltage layer to define a component cavity and to provide physical access to said ground plane, a metallic film conductive voltage plane on the top of said dielectric voltage layer, said voltage plane being for connection to a voltage potential with respect to said ground plane, isolated ground pads on said voltage plane, said isolated ground pads being electrically connected to said ground plane through said dielectric voltage layer so that said voltage plane and said isolated ground pads are both on said voltage layer;
   a dielectric signal layer, said dielectric signal layer having walls defining an opening therethrough in alignment with said component opening through said voltage layer to further define said component cavity and to expose said ground plane, said signal layer having walls defining a chip opening therethrough adjacent said component opening to define a chip cavity, said chip opening exposing a portion of said voltage plane to define the bottom of said chip cavity and exposing at least a portion of said ground pads in said voltage plane, a plurality of metallic traces on said signal layer forming a signal plane, said metallic traces terminating in chip connection pads adjacent said chip opening and terminating in pads adjacent the outer periphery of said signal layer; and
   a top dielectric layer positioned on the top of said signal plane so that said package contains no more than five dielectric layers carrying conductive planes thereon, said top dielectric layer having a chip opening therein larger than said chip opening in said signal dielectric layer to form an interior shelf on said dielectric signal layer to expose said chip connection pads on said interior shelf, said dielectric top layer having package connection pads around the exterior edge of said dielectric top layer, said connection pads on said dielectric top layer around the exterior thereof being connected to said pads on said dielectric signal layer, said chip opening being arranged so that a chip of maximum size may be housed within said package.

2. The package of claim 1 wherein said package is rectangular having a major length dimension and a minor width dimension and having walls defining said chip opening in said dielectric signal layer and said dielectric top layer are rectangular and are oriented at 45° with respect to said major and minor dimensions of said package.

3. The package of claim 2 wherein said walls defining said chip opening in said dielectric signal layer and said dielectric top layer define a substantially square opening.

4. The package of claim 1 wherein said package further includes a second dielectric ground layer together with a second electrically conductive ground plane thereon, said second dielectric ground layer and ground plane being positioned between said voltage plane and said dielectric signal layer, said second ground plane and second dielectric ground layer having walls defining a component opening therein in alignment with said component openings in said dielectric voltage layer and dielectric signal layer and having walls defining a chip opening therein, said chip opening being in alignment with said chip opening in said dielectric signal layer and being of such size as to cover said ground pads on said dielectric voltage layer and to provide a shelf extending inward from said opening in said dielectric signal layer, said second ground plane having voltage pads thereon.

5. The package of claim 4 wherein said package is rectangular having a major length dimension and a minor width dimension and said walls defining said chip openings in said dielectric signal layer and said dielectric top layer are rectangular and are oriented at 45° with respect to said major and minor dimensions of said package.

6. The package of claim 5 wherein said walls defining said chip openings in said dielectric signal layer and said dielectric top layer define substantially square openings.

7. A package for integrated circuit chips comprising:
   a plurality of layers consisting of a base layer, a voltage layer, a ground layer, a signal layer and a top layer, each of said layers being made of dielectric material;
   walls defining a semiconductor chip opening through said top layer and said signal layer;
   walls defining a discrete component opening through said top layer, said signal layer, said ground layer and said voltage layer down to said base layer;
   an electrically conductive first ground plane on said base layer, said first ground plane extending under said semiconductor chip opening and under said discrete component opening;
   an electrically conductive voltage plane on said voltage layer, said voltage plane extending under said opening in said signal layer to define the bottom of said semiconductor chip;

an electrically conductive second ground plane on said ground layer defining ground connection pads, voltage connection pads on said ground layer adjacent said ground connection pads on said ground layer, said voltage connection pads being connected through said ground layer to said voltage plane, said ground connection pads and said voltage connection pads being positioned adjacent the edges of said semiconductor chip opening so that both said voltage plane and said ground connection pads are on said ground layer to form a single shelf for voltage and ground connection;

an electrically conductive signal plane on said signal layer, said signal plane terminating in semiconductor chip connection pads adjacent said semiconductor chip opening in said signal layer and terminating in connection pads adjacent the outer edges of said signal layer so that said package contains no more than four dielectric layers having a conductive plane thereon;

said semiconductor chip opening in said top layer being larger than said semiconductor chip opening in said signal layer so as to define an exposed interior shelf on said signal layer carrying said semiconductor chip connection pads in said signal plane; and means for attaching a cover on said top layer to enclose within said semiconductor chip opening a chip which has been positioned therein.

8. The package of claim 7 wherein said layers are ceramic and said planes are metal film and said package is sintered together to form a hermetic package.

9. The package of claim 7 wherein said walls defining said semiconductor chip opening in said ground layer are positioned so that said ground layer covers said ground pads in said voltage layer and are positioned to present a shelf within said semiconductor chip opening in said signal layer, said second ground plane extending onto said shelf exposed by said opening in said signal layer, said second ground plane having pads on said shelf and voltage pads on said shelf so that ground and voltage connections can be made on said shelf.

10. The package of claim 9 wherein said layers are ceramic and said planes are metal film and said package is sintered together to form a hermetic package.

11. The package of claim 10 wherein the exterior edges of said package define the package as being rectangular and said semiconductor chip opening in said layers is square, said square opening being set at substantially 45° with respect to the edges of said package.

12. The package of claim 7 wherein the exterior edges of said package define the package as being rectangular and said semiconductor chip opening in said layers is square, said square opening being set at substantially 45° with respect to the edges of said package.

* * * * *